(12) United States Patent
Acar et al.

(10) Patent No.: US 10,101,381 B2
(45) Date of Patent: Oct. 16, 2018

(54) SPACE TRANSFORMATION METHODS

(75) Inventors: Erkan Acar, Eugene, OR (US); Pooya Tadayon, Portland, OR (US); Armen Y. Balian, Portland, OR (US); Ethan Caughey, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 475 days.

(21) Appl. No.: 13/600,460

(22) Filed: Aug. 31, 2012

(65) Prior Publication Data

US 2014/0062522 A1 Mar. 6, 2014

(51) Int. Cl.
*G01R 31/26* (2014.01)
*G01R 3/00* (2006.01)
*G01R 31/28* (2006.01)
*G01R 1/073* (2006.01)

(52) U.S. Cl.
CPC ........... *G01R 31/2607* (2013.01); *G01R 3/00* (2013.01); *G01R 31/2889* (2013.01); *G01R 1/07378* (2013.01); *Y10T 29/49004* (2015.01); *Y10T 29/49128* (2015.01)

(58) Field of Classification Search
CPC ............ G01R 31/2896; G01R 31/2851; G01R 31/26; G01R 31/2801; G01R 31/2889
USPC .......................... 324/762.03, 690, 696, 724, 324/754.01–754.09
See application file for complete search history.

(56) References Cited

U.S. PATENT DOCUMENTS

| | | | |
|---|---|---|---|
| 2005/0099199 A1* | 5/2005 | Sugita | G01B 31/318513 324/750.3 |
| 2005/0156165 A1* | 7/2005 | Eldridge et al. | 257/48 |
| 2008/0100320 A1* | 5/2008 | Miller et al. | 324/754 |
| 2011/0148456 A1* | 6/2011 | Mooyman-Beck et al. | 324/762.02 |

* cited by examiner

*Primary Examiner* — Son Le
(74) *Attorney, Agent, or Firm* — Schwabe, Williamson & Wyatt, P.C.

(57) ABSTRACT

A test system includes a test printed circuit board (PCB), a flip chip package mounted on the PCB, one or more test probes coupled to the flip chip package and a first integrated circuit (IC) coupled to the test probes to enable testing of the first IC using electrical circuitry of the flip chip package.

10 Claims, 3 Drawing Sheets

SPACE TRANSFORMATION METHODS

FIELD OF THE INVENTION

The present disclosure generally relates to integrated circuits, and more particularly, to testing integrated circuits.

BACKGROUND

Integrated circuits are designed to operate under a variety of environmental conditions. To ensure that an integrated circuit operates correctly prior to packaging, the integrated circuit is coupled to a test system for testing. A test system often includes a custom designed space transformer that is implemented at wafer level test for electrical testing of products before packaging. As multi-chip modules become more mainstream, it becomes critical to enable as much content during this test step so that a bare die test can be achieved. Bare die tests may include, but are not limited to, wafer or die level functional or structural test and known good die test. The space transformer plays a key role in enabling bare die test.

FIG. 1 illustrates an exemplary electrical test system. In the test system, electrical currents are applied to die bumps using miniature needles that are mechanically attached to the space transformer. The space transformer includes routing that translates the die bump pitch to a much wider contact pitch that can be mated with the tester motherboard.

Conventional space transformer solutions include several routing and power layers in order to provide the necessary test stimulus to the die. The test signals are routed through many interconnects, such as thin film vias, thin film transmission lines, ceramic vias, interposers, and motherboard routing. This routing establishes electrical contact between the dice and the tester, which allows direct electrical testing. As the packaging technologies trend toward multi-chip modules, where multiple chips are attached to the same package, several complications arise for testing.

First, the devices under test (DUT) are designed to interact with integrated circuits (ICs) that share the same package. This enables the designers to simplify the buffer designs, which lead to several design optimizations. For example, when a chipset is mounted on the same package as the CPU, the drivers on the CPU can be designed so they require much smaller die area, which leads to power and cost reduction. However for test, these circuits need to be routed to the tester for electrical test. The electrical routing length can be significantly longer than the drive capabilities of the circuits, which limits the test capabilities.

In addition, multi-chip packaging allows much denser input/output (I/O) on die to communicate with peripheral chips. Using the traditional test approaches, all of these additional I/Os need to be tested, which complicates the routing on the space transformer and require additional test resources.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Figure 1:
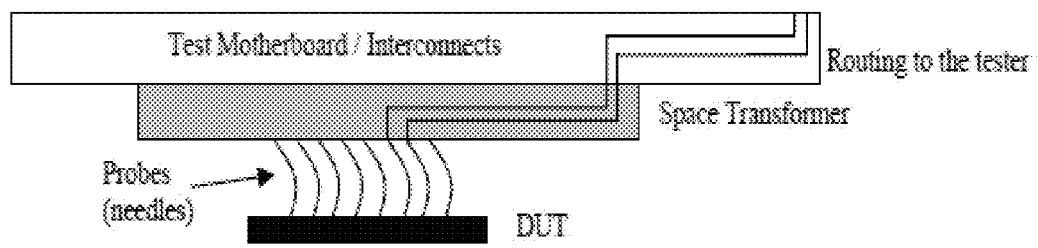
FIG. 1 illustrates a conventional exemplary test system.
Figure 2A:
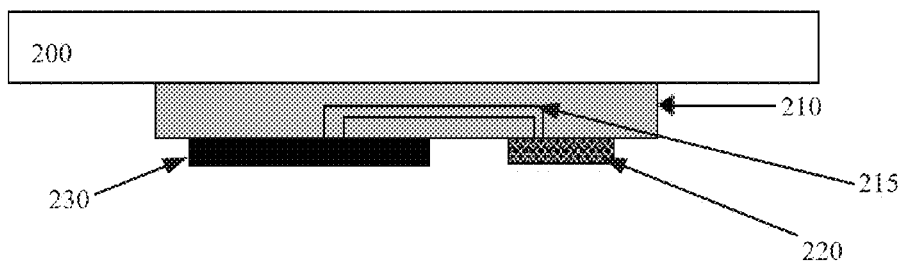
FIGS. 2A and 2B illustrate embodiments of multi-chip package configurations.
Figure 2B:
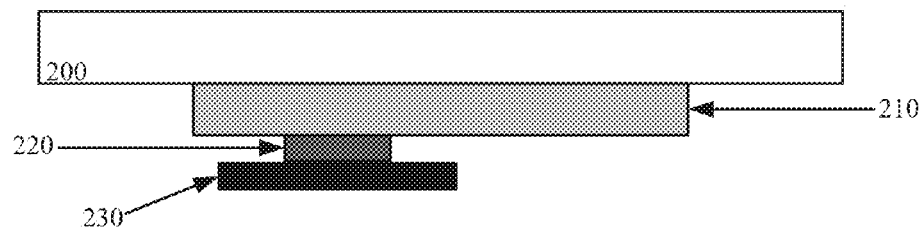

FIGS. 2A and 2B illustrate embodiments of a multi-chip package product configuration. In FIG. 2A, a flip chip package 210 is mounted on a printed circuit board (PCB) 200. Flip chip package 210 may be defined as the substrate on which the product IC is mounted in its end use environment or a custom designed substrate for test purposes. In one embodiment, PCB 200 is a product motherboard that includes various interconnections for electrical routing. Flip chip package 210 provides an interconnection for integrated circuits ICs to PCB 200 circuitry. In one embodiment, flip chip package 210 provides interconnection to each IC via solder bumps (not shown) deposited onto the pads of the IC.

In a further embodiment, the IC is flipped over for mounting to flip chip package 210 so that the top side of the IC faces down, and aligned so that its pads align with matching pads on flip chip package 210. Subsequently, solder is flowed to complete the interconnect. According to one embodiment, flip chip package 210 is comprised of an organic material. However in other embodiments, flip chip package 210 may be comprised of a ceramic material, glass material, or silicon.

As shown in FIG. 2A, ICs 220 and 230 are mounted to flip chip package 210. In one embodiment, IC 220 is a peripheral IC, while IC 230 is a main IC. For instance, IC 230 may be a central processing unit (CPU), while IC 220 may be a chipset IC with interconnections 215 to IC 230 via to be used flip chip package 210. However, other embodiments may feature different functions for ICs 220 and 230, or may include more than two IC chips.

FIG. 2B illustrates another embodiment of a multi-chip package product configuration in which IC 220 continues to be mounted on flip chip package 210. However in this embodiment, IC 230 is mounted directly on IC 220 using Through Silicon Via (TSV) technology. As discussed above, testing is performed on IC 230 as a DUT prior to implementing one of the product configurations shown in FIGS. 2A and 2B in order to ensure that IC 230 operates correctly prior to packaging.

In one embodiment, the DUT undergoes a final test once initial tests indicate that the DUT has transitioned towards becoming a known-good-die (KGD). Thus, the DUT is connected to a package during the final test environment and accompanied by all peripheral ICs (e.g., IC 220). As previously discussed, space transformers are typically implemented for these testing purposes since a space transformer not only looks like the package configuration, but includes all of the peripheral chips in order to achieve a final test like results at a wafer sort socket.

According to one embodiment, the product flip chip package is implemented as the space transformer during testing purposes, rather than a custom space transformer being designed for test. In such an embodiment, the actual product flip chip package includes all routing required for the testing operation of the DUT.

Figure 3A:
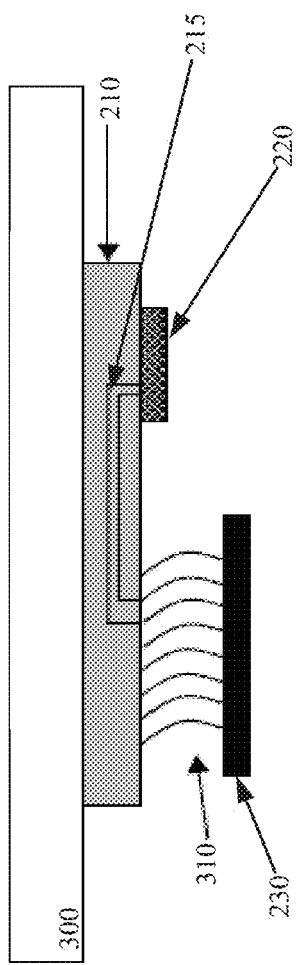
FIGS. 3A and 3B illustrate embodiments of a test system for multi-chip package configurations.
Figure 3B:
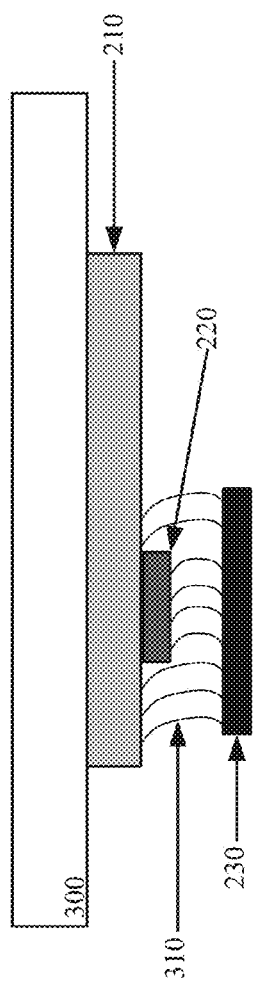

FIGS. 3A and 3B illustrate embodiments of a test system for multi-chip package configurations. FIG. 3A shows a flip chip package 210 mounted on a test PCB 300. In such an embodiment, peripheral IC 220 remains mounted to flip chip package 210, as in the product configuration. However, the DUT IC 230 is coupled to flip chip package 210 via test probes 310.

As shown in FIG. 3A, there is no need to connect these circuits to a tester channel or test PCB 300 for electrical testing since the circuits on the DUT IC 230 can communicate to the peripheral chips during test through the test probes and the existing routing between the DUT IC 230 and the peripheral chips. FIG. 3B illustrates the embodiment of a multi-chip test system in which DUT IC 230 is mounted on peripheral IC 220. In this embodiment, test probes 310 are connected directly to the TSV pads on the peripheral IC 220. The peripheral IC 220 may be mounted on the flip chip package 210, or alternatively embedded in flip chip package 210.

The implementation of flip chip package 210 for testing enables a significant reduction in total routing length between the DUT IC 230 and the peripheral IC 220. For example, the total routing length can be reduced from 13" to 0.4". This reduction provides the package designers with the flexibility to reduce the drive strength to meet design specifications without needing to increase the complexity of design for test purposes, such as additional design for test (Dft) circuits and larger transistors.

Moreover, since flip chip package 210 is optimized for the actual product and includes all of the necessary routing, its electrical performance will be significantly higher compared to the electrical performance of a traditional space transformer. This higher performance results in improved yields and higher speed bins compared to traditional testing (e.g., power path impedance can be significantly reduced).

Figure 4:
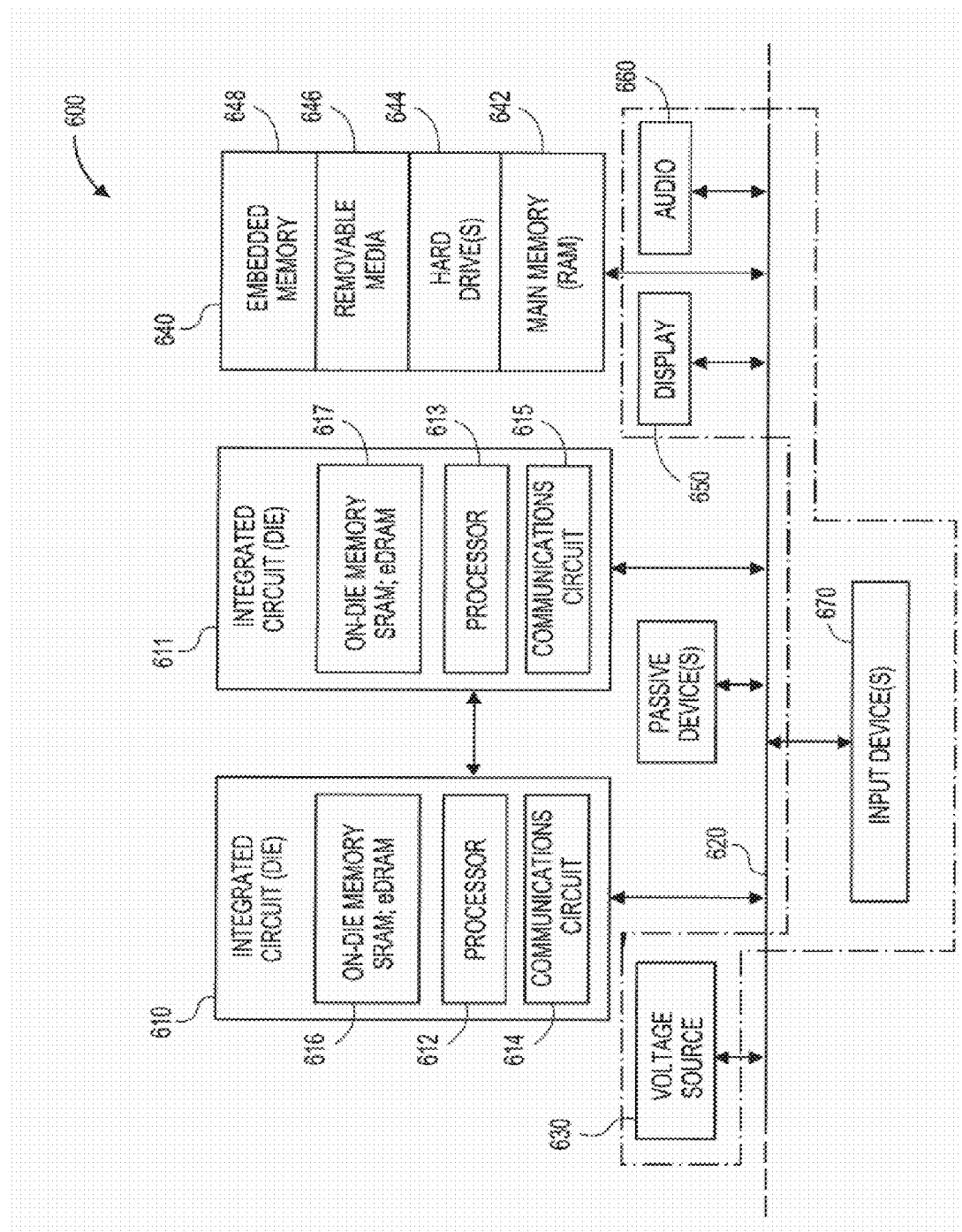
FIG. 4 illustrates one embodiment of a computer system.

FIG. 4 illustrates one embodiment of a computer system 400. The computer system 400 (also referred to as the electronic system 400) as depicted can embody a test system that includes a flip chip package mounted on a test PCB, with a peripheral chip mounted on the flip chip package and a DUT IC coupled to the flip chip package via test probes.

The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be a server system. The computer system 400 may be a supercomputer or high-performance computing system.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 610 through the system bus 420.

The integrated circuit 410 is electrically coupled to the system bus 420 and includes any circuit, or combination of circuits according to an embodiment. In an embodiment, the integrated circuit 410 includes a processor 412 that can be of any type. As used herein, the processor 412 may mean any type of circuit such as, but not limited to, a microprocessor, a microcontroller, a graphics processor, a digital signal processor, or another processor. In an embodiment, the processor 412 includes a flip chip package mounted on a test PCB, with a peripheral chip mounted on the flip chip package and a DUT IC coupled to the flip chip package via test probes.

In an embodiment, SRAM embodiments are found in memory caches of the processor. Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems, or a communications circuit for servers. In an embodiment, the integrated circuit 410 includes on-die memory 416 such as static random-access memory (SRAM). In an embodiment, the integrated circuit 410 includes embedded on-die memory 416 such as embedded dynamic random-access memory (eDRAM).

In an embodiment, the integrated circuit 410 is complemented with a subsequent integrated circuit 411. Useful embodiments include a dual processor 413 and a dual communications circuit 415 and dual on-die memory 417 such as SRAM. In an embodiment, the dual integrated circuit 410 includes embedded on-die memory 417 such as eDRAM.

In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448 such as the first die in an embedded TSV die stack, according to an embodiment.

In an embodiment, the electronic system 400 also includes a display device 450, an audio output 460. In an embodiment, the electronic system 400 includes an input device such as a controller 470 that may be a keyboard, mouse, trackball, game controller, microphone, voice-recognition device, or any other input device that inputs information into the electronic system 400. In an embodiment, an input device 470 is a camera. In an embodiment, an input device 470 is a digital sound recorder. In an embodiment, an input device 470 is a camera and a digital sound recorder.

As shown herein, the integrated circuit 410 can be implemented in a number of different embodiments, including a test system that includes a flip chip package mounted on a test PCB, with a peripheral chip mounted on the flip chip package and a DUT IC coupled to the flip chip package via test probes, and their equivalents, an electronic system, a computer system, one or more methods of fabricating an integrated circuit, and one or more methods of fabricating an electronic assembly that includes a semiconductor die packaged according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with a thermal interface unit and their equivalents. A foundation substrate may be included, as represented by the dashed line of FIG. 4. Passive devices may also be included, as is also depicted in FIG. 4.

Although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A test system comprising:
   a test printed circuit board (PCB); and
   a multi-chip package mounted on the test PCB, comprising:
      a flip chip package;
      one or more test probes having a first end coupled to the flip chip package;
      a central processing unit (CPU) integrated circuit (IC) coupled to a second end of the test probes to enable testing of the first product IC using electrical circuitry of the flip chip package; and
      a chipset IC mounted on the flip chip package to communicate with the CPU IC during testing of the CPU IC via routing between the first product IC and the chipset IC.

2. The test system of claim 1 wherein the flip chip package includes routing to enable the communications with the chipset IC.

3. The test system of claim 1 wherein communications between the CPU IC and the chipset IC is performed through the test probes.

4. The test system of claim 1 wherein the CPU IC is mounted on the chipset IC.

5. The test system of claim 4 wherein the test probes are coupled to the flip chip package by directly connecting to Through Silicon Via (TSV) pads of the chipset IC.

6. A method comprising:
   mounting a flip chip package included in a multi-chip package on a test printed circuit board (PCB);
   coupling a first end of one or more test probes to the flip chip package; and
   coupling central processing unit (CPU) included in the multi-chip package to a second end of the test probes to enable testing of the CPU IC using electrical circuitry of the flip chip package;
   mounting a chipset IC included in the multi-chip package on the flip chip package; and
   testing the CPU IC via communications with the chipset IC.

7. The method of claim 6 wherein the flip chip package includes routing to enable the communications with the chipset IC.

8. The method of claim 7 wherein communications between the CPU IC is and the chipset IC is performed through the test probes.

9. The method of claim 6 further comprising mounting the CPU IC on the chipset IC.

10. The method of claim 9 wherein the test probes are coupled to the flip chip package by connecting directly to Through Silicon Via (TSV) of the chipset IC.

* * * * *